(12) United States Patent
Higashi et al.

(10) Patent No.: US 6,773,831 B2
(45) Date of Patent: Aug. 10, 2004

(54) ORGANIC ELECTROLUMINESCENT DEVICE

(75) Inventors: Hisahiro Higashi, Chiba (JP); Chishio Hosokawa, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 10/078,666

(22) Filed: Feb. 21, 2002

(65) Prior Publication Data

US 2002/0136924 A1 Sep. 26, 2002

Related U.S. Application Data

(63) Continuation of application No. 09/424,870, filed as application No. PCT/JP99/01873 on Apr. 8, 1999, now Pat. No. 6,406,804.

(30) Foreign Application Priority Data

Apr. 9, 1998 (JP) .............................................. 10-98013

(51) Int. Cl.[7] .............................................. H05B 33/14
(52) U.S. Cl. ...................... 428/690; 428/428; 428/704; 428/9.7; 313/504; 313/506; 252/301.16; 257/40; 257/103
(58) Field of Search .............................. 428/690, 428, 428/704, 917; 313/504, 506; 252/301.16; 257/40, 103

(56) References Cited

U.S. PATENT DOCUMENTS

| | | | |
|---|---|---|---|
| 5,503,910 A | 4/1996 | Matsuura et al. | |
| 5,536,949 A | 7/1996 | Hosokawa et al. | |
| 5,601,903 A | 2/1997 | Fuji et al. | |
| 5,879,821 A | * 3/1999 | Hsieh | 428/690 |
| 5,932,363 A | * 8/1999 | Hu et al. | 428/690 |
| 6,280,859 B1 | 8/2001 | Onikubo et al. | |

FOREIGN PATENT DOCUMENTS

| | | |
|---|---|---|
| EP | 579151 | 6/1994 |
| JP | 3-205479 A | 9/1991 |
| JP | 6-172751 A | 6/1994 |
| JP | 8-78163 A | 3/1996 |
| JP | 8-311051 A | 11/1996 |
| JP | 9-188756 | 7/1997 |
| JP | 10-251633 A | 9/1998 |
| JP | 11-60660 A | 3/1999 |

OTHER PUBLICATIONS

Tamoto et al. (Chem. Mater. 1997, 9, pp1077–1085).*
International search report PCT/JP99/01873, copy was submitted by applicants.*

* cited by examiner

*Primary Examiner*—Deborah Jones
*Assistant Examiner*—Ling Xu
(74) *Attorney, Agent, or Firm*—Oblon, Spivak, McClelland, Maier & Neustadt, P.C.

(57) ABSTRACT

The invention provides an organic EL device which produces high luminance and is durable and which can be fabricated with ease. The organic EL device comprises two electrodes and a light-emitting layer sandwiched therebetween, in which the light-emitting layer contains a molecular compound having an electron-transporting unit and a hole-transporting unit bonded to each other via a linking group.

17 Claims, 1 Drawing Sheet

ORGANIC ELECTROLUMINESCENT DEVICE

TECHNICAL FIELD

The present invention relates to an organic electroluminescent device (hereinafter referred to as an organic EL device). More precisely, it relates to an organic EL device which produces high luminance and is durable and which can be fabricated with ease.

BACKGROUND OF THE INVENTION

Organic EL devices in which the light-emitting layer is of a mixture of a hole-transporting compound and an electron-transporting compound are disclosed in Japanese Patent Laid-Open No. 250292/1990, 291696/1990 or 790/1991. In the devices disclosed, however, the organic compounds used are poor in hole-transporting or electron-transporting capabilities, and the devices with them could hardly achieve high luminance. In addition, the compounds are poor in heat resistance and durability. Therefore, another problem with the devices is that, when they are driven continuously, the compounds therein are readily crystallized with the result that the luminance of the devices is often lowered. Moreover, it is not easy to uniformly mix the hole-transporting compound and the electron-transporting compound for the devices. Therefore, still another problem with the devices is that the light from them is often not uniform and that the organic compounds for them could hardly formed into uniform and thin films.

Under the situation, Japanese Patent Laid-Open No. 210790/1990 discloses an organic EL device in which the light-emitting layer comprises an organic compound having both hole-transporting capabilities and electron-transporting capabilities. However, the device disclosed is still problematic in that the organic compounds applicable thereto are limited for the combination of their structures for electron transportation and hole transportation. Specifically, it is difficult to well control the compounds for their electron-transporting capabilities and hole-transporting capabilities, and, in addition, the balance of those transporting capabilities of the compounds is not good.

What is more, the electron-transporting capabilities and the hole-transporting capabilities of the organic compounds usable in the device disclosed are still unsatisfactory. Therefore, the organic EL device with the compound of that type could hardly achieve high luminance. In addition, the compounds are poor in heat resistance and durability. Therefore, still another problem with the device is that, when it is driven continuously, the compound therein is readily crystallized with the result that the luminance of the device is often lowered.

The present inventors have found that, when a compound having by itself both an electron-transporting unit with good electron-transporting capabilities and a hole-transporting unit with good hole-transporting capabilities in the molecule, in which the units are bonded to each other directly or via a linking group, is present in a light-emitting layer in an organic EL device, it could exhibit well-balanced electron-transporting capabilities and hole-transporting capabilities, that the light-emitting layer containing the compound of that type is highly durable even though it has a single-layered structure, and that the organic EL device comprising the light-emitting layer of that type produces high luminance, and have completed the present invention.

The properties of the hole-transporting unit in the compound are characterized in that the unit exhibits by itself good hole-transporting capabilities and can be formed into thin and durable films with no problem. Similarly, the properties of the electron-transporting unit in the compound are characterized in that the unit exhibits by itself good electron-transporting capabilities and can be formed into thin and durable films with no problem.

Specifically, the object of the invention is to provide an organic EL device which produces high luminance and is durable and which can be fabricated with ease.

DISCLOSURE OF THE INVENTION

The invention relates to an organic EL device comprising two electrodes and a light-emitting layer sandwiched therebetween, in which the light-emitting layer comprises a molecular compound having an electron-transporting unit and a hole-transporting unit bonded to each other directly or via a linking group.

With the molecular compound of that type having an electron-transporting unit and a hole-transporting unit bonded to each other directly or via a linking group, the electron-transporting capabilities and the hole-transporting capabilities of the light-emitting layer are well balanced in the organic EL device. Having the light-emitting layer of that type, therefore, the organic EL device produces high luminance and is durable.

In the organic EL device of the invention, it is preferable that the light-emitting layer contains a recombination site-forming substance.

Around the center of the light-emitting layer thus containing a recombination site-forming substance, electrons and holes can be recombined. Having the light-emitting layer of the preferred type, therefore, the organic EL device produces higher luminance.

In the organic EL device of the invention, it is also preferable that the electron mobility through the electron-transporting unit is at least $1\times10^{-6}$ cm$^2$/Vs. Similarly in the device, it is also preferable that the hole mobility through the hole-transporting unit is at least $1\times10^{-6}$ cm$^2$/Vs. The charge mobility through the unit can be determined, for example, by forming the unit into a thin film, put the film between a pair of electrodes to fabricate a device, and measuring the device for the charge mobility through the unit therein according to a method of time of flight or the like.

In the organic EL device of the invention, it is also preferable that the electron-transporting unit is of at least one compound selected from perinone derivatives, oxadiazole derivatives, triazole derivatives, phenanthroline derivatives, quinoxaline derivatives, sirol derivatives, condensed polycyclic aromatic derivatives having at least three rings, and quinoline complex derivatives.

In the organic EL device of the invention, it is also preferable that the hole-transporting unit is of a combination of triphenylamines and stilbene derivatives, or of any one of the compounds.

In the organic EL device of the invention, it is also preferable that the linking group is at least one selected from alkylene groups, vinylene groups, ethanediylidene groups, styryl groups, ether groups, amine groups and arylene groups. The linking group may form a part of the electron-transporting unit or the hole-transporting unit.

In the organic EL device of the invention, it is more preferable that the molecular compound is at least one selected from those of the following formulae (1) to (14). In formula (4), $R^1$, $R^2$, $R^3$ and $R^4$ may be the same or different and each represents an alkyl group having from 1 to 10 carbon atoms, an aryl group having from 6 to 20 carbon atoms, an alkyl-substituted aryl group having from 6 to 20 carbon atoms, or an aryloxyaryl group having from 12 to 30 carbon atoms.

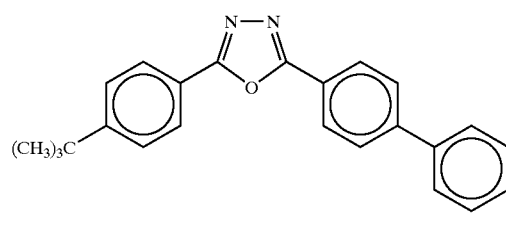
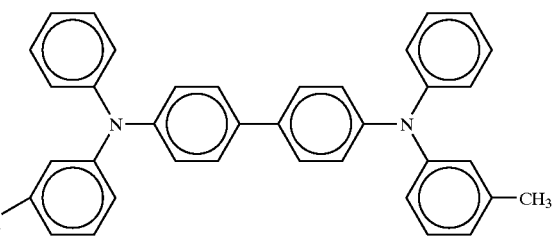
(1)
(2)
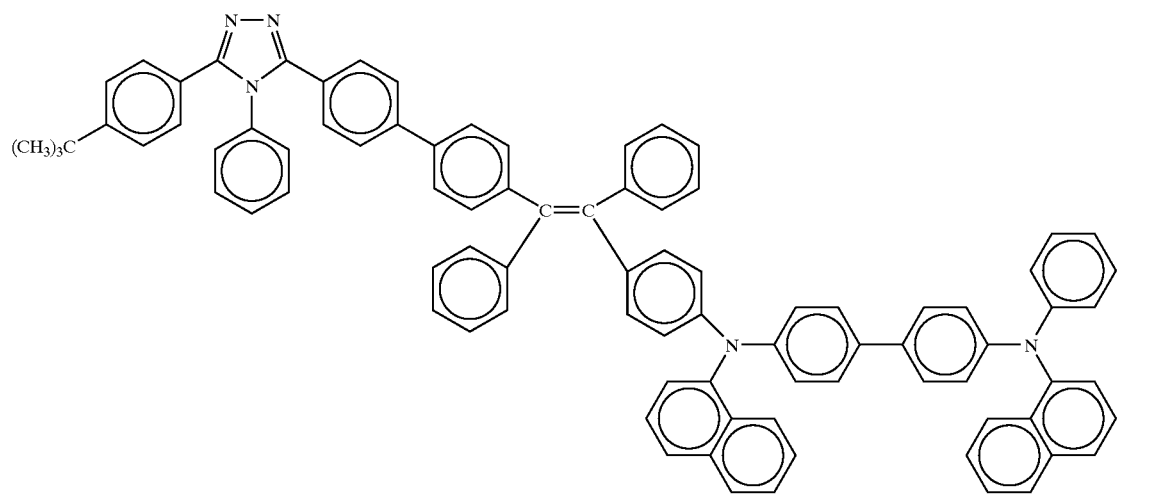
(3)
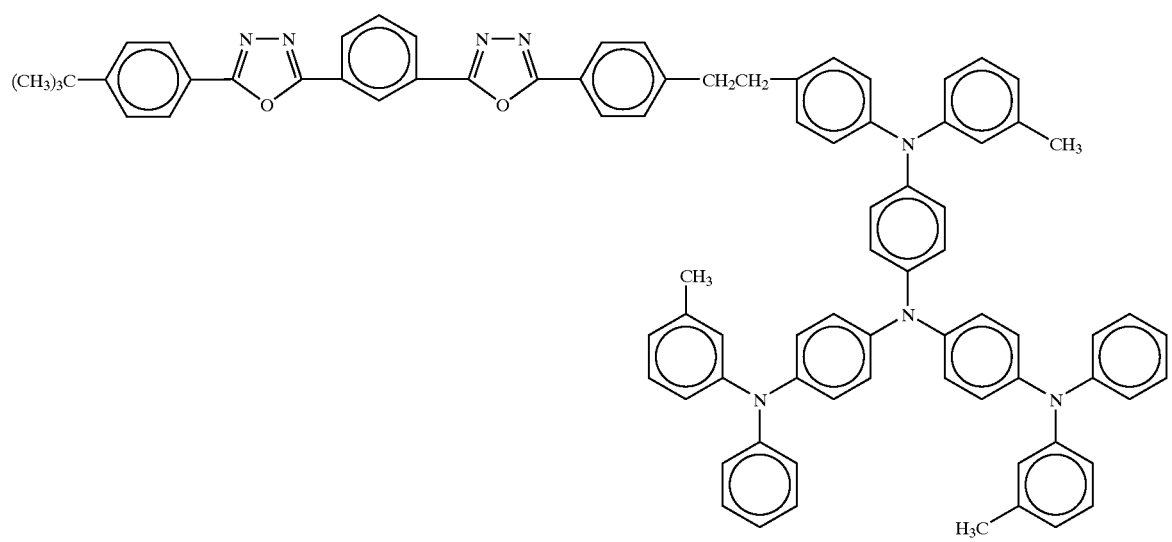
(4)
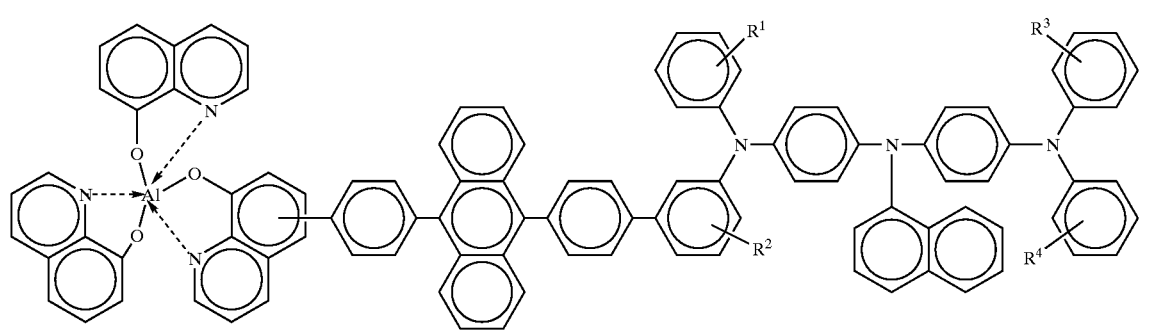

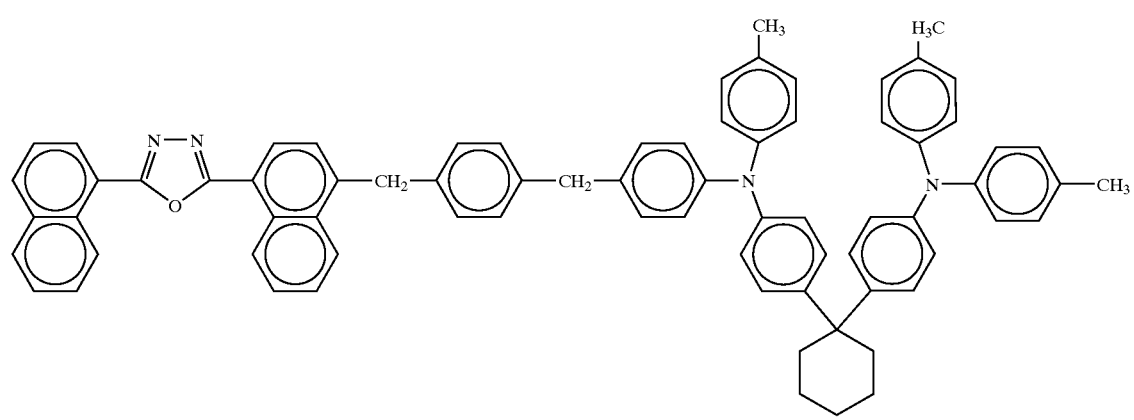
(5)
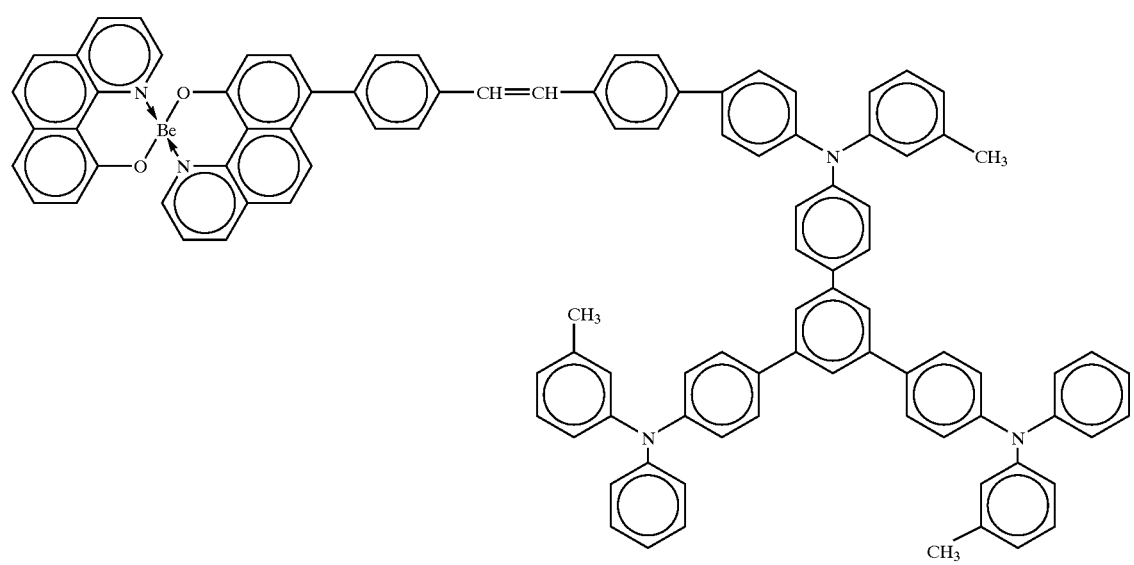
(6)
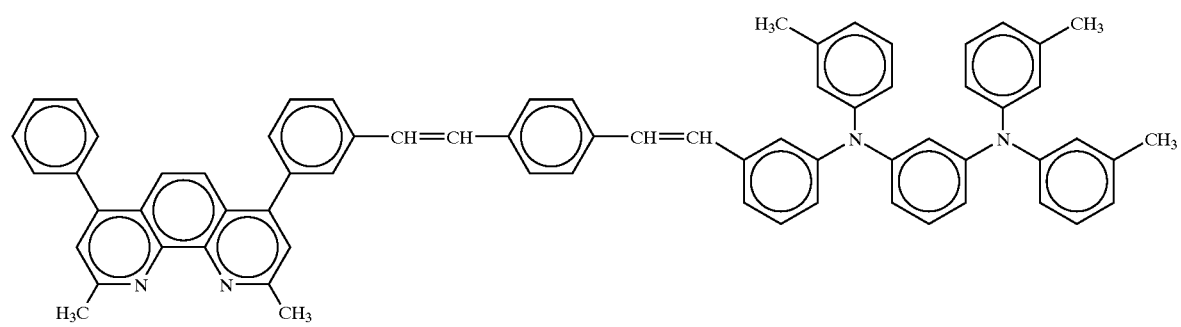
(7)

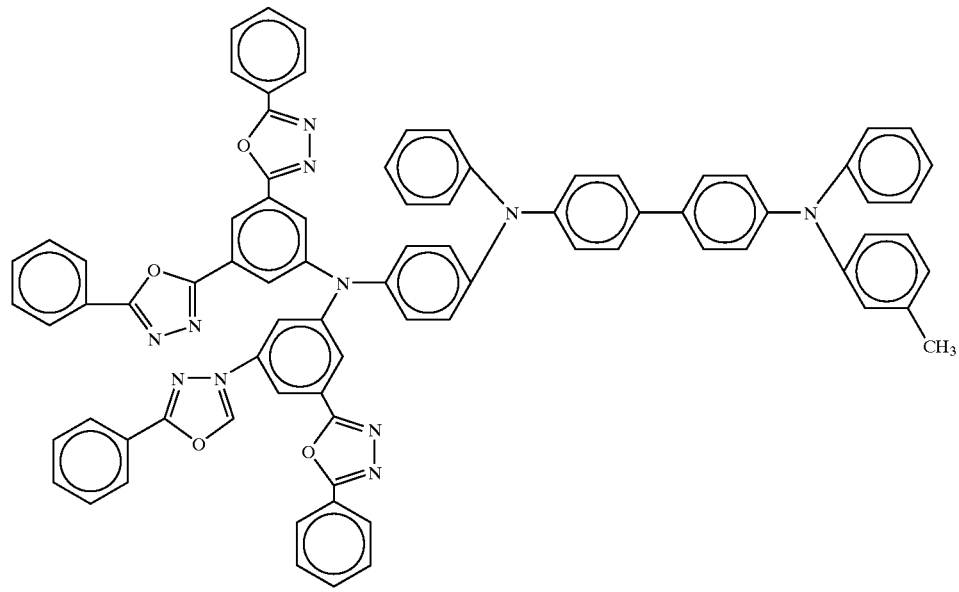
(8)
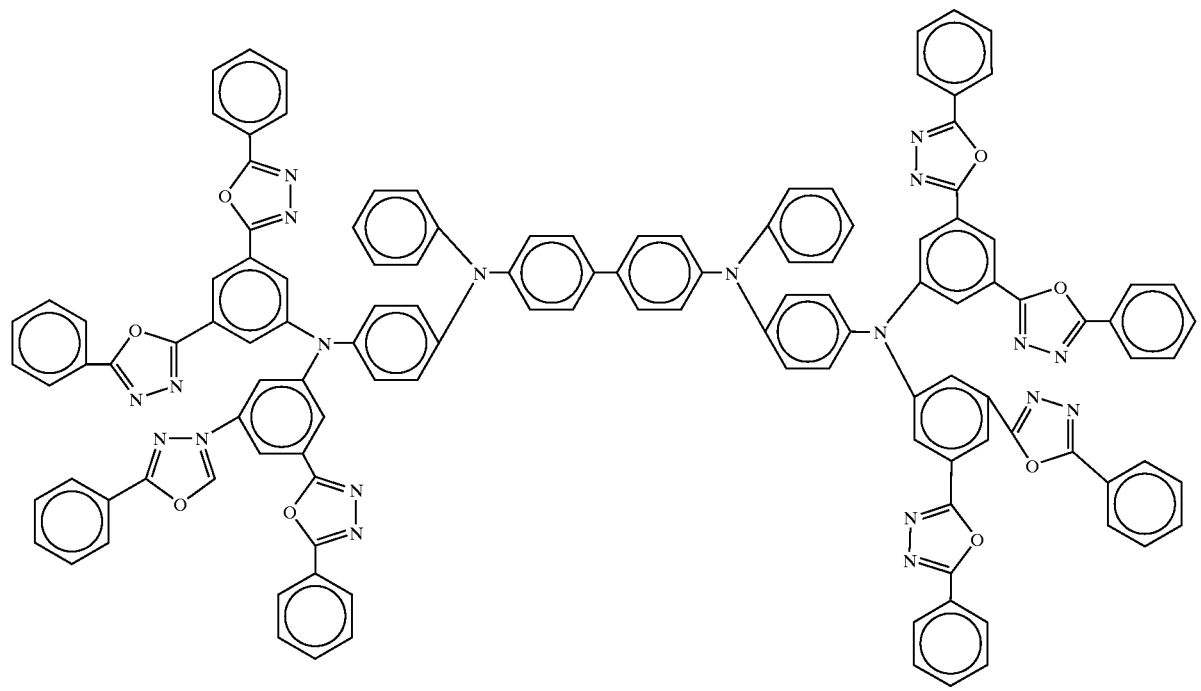
(9)
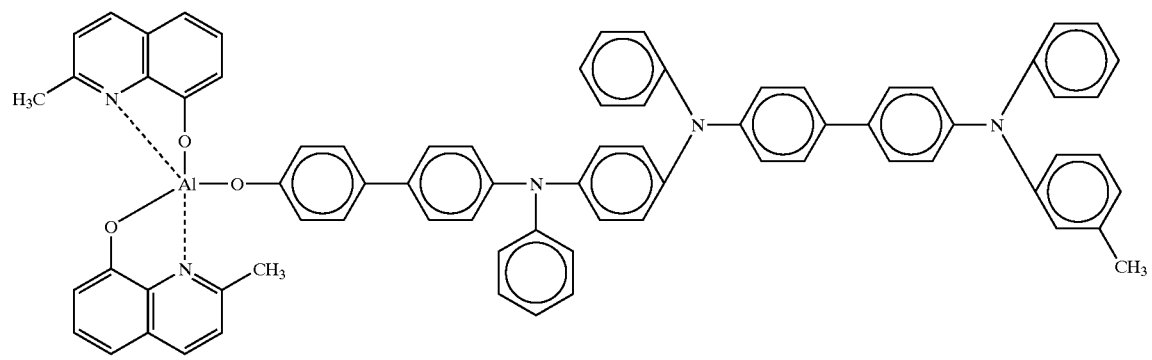
(10)

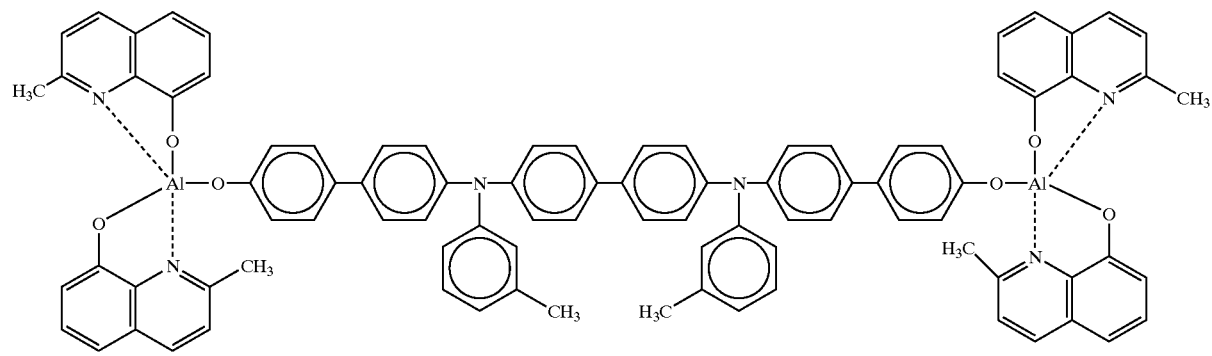
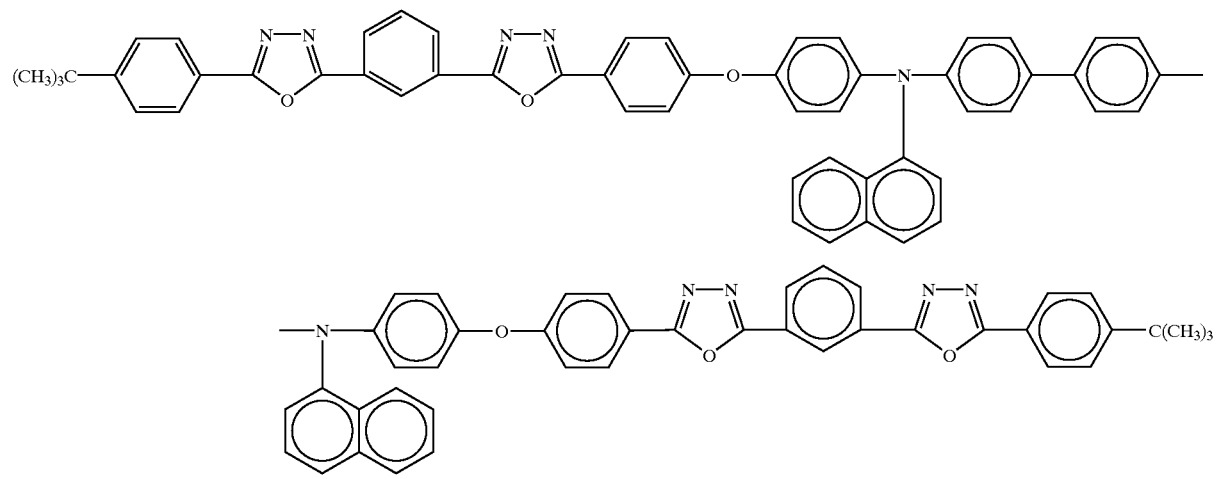
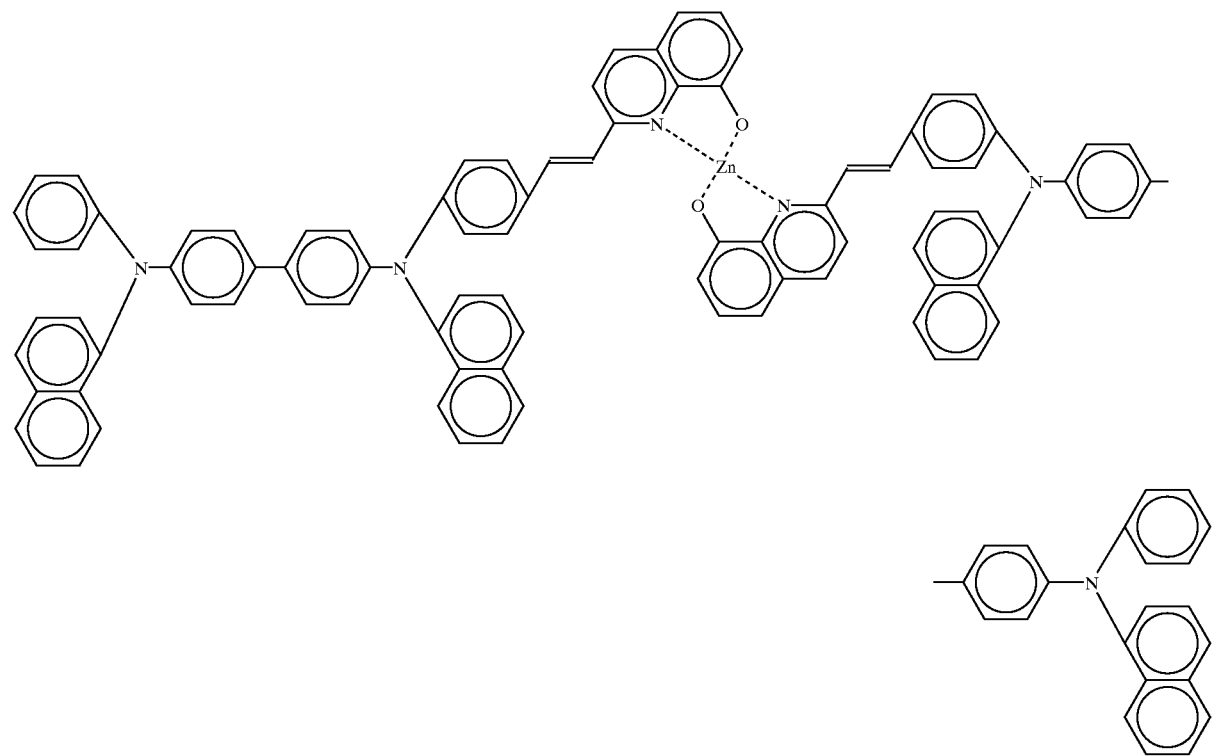

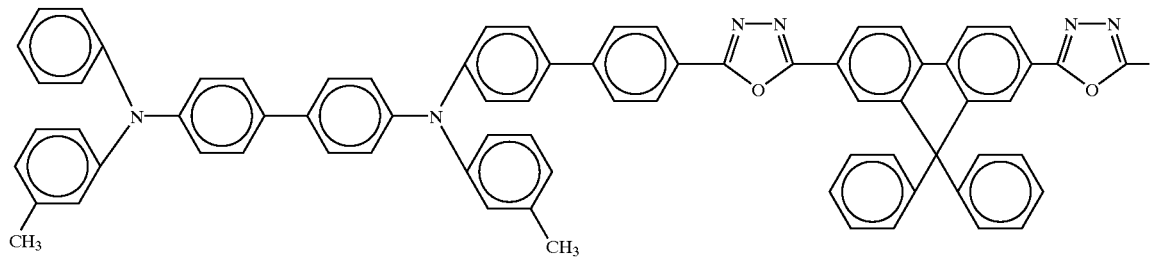

(14)

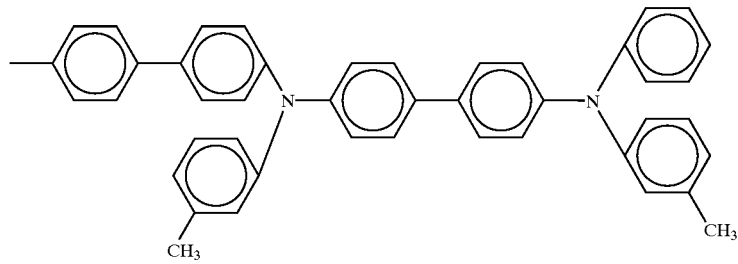

In the organic EL device of the invention, it is still preferable that the recombination site-forming substance is at least one compound selected from styrylamine compounds, quinacridone derivatives, rubrene derivatives, coumarin derivatives and pyran derivatives.

In the organic EL device of the invention, it is further preferable that the electron-transporting unit and the hole-transporting unit do not form an exciplex or a charge transfer complex. If the units form an exciplex or a charge transfer complex, the exciplex or the charge transfer complex formed in the light-emitting layer will interfere with energy transfer to the recombination site-forming substance in the layer, whereby the luminance of the device and even the luminous efficiency thereof will be much lowered.

In the organic EL device of the invention, the light-emitting layer may be of a copolymer having an electron-transporting unit and a hole-transporting unit. Preferably, the copolymer has the electron-transporting unit and the hole-transporting unit both as repetitive units therein. Especially preferably the copolymer a structure represented by:

[(hole-transporting unit)$_m$–(electron-transporting unit)$_n$]$_x$–, wherein m>1, n>1, and x>1.

Concretely, for example, usable are copolymers having a structure of a diamine-type hole-transporting unit combined with an oxadiazole-type electron-transporting unit, which is represented by the following formula (15):

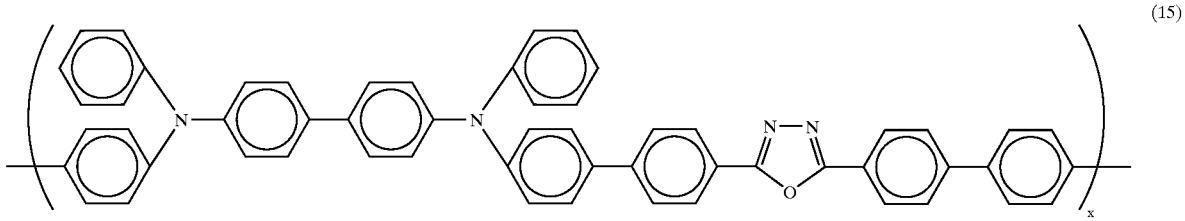

(15)

and copolymers having a structure of a diamine-type hole-transporting unit combined with a quinoline complex-type electron-transporting unit, which is represented by the following formula (16):

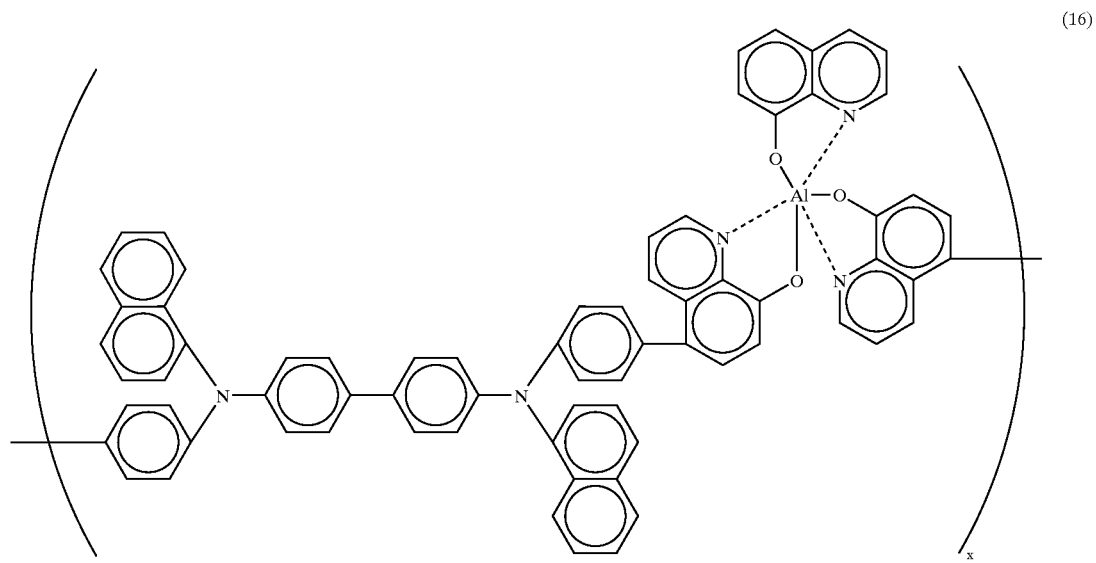

(16)

BRIEF DESCRIPTION OF THE DRAWING

In FIG. 1, the reference numeral 1 indicates a substrate, the reference numeral 2 indicates an anode, the reference numeral 3 indicates a light-emitting layer, the reference numeral 4 indicates a cathode, the reference numeral 5 indicates a power source, and the reference numeral 10 indicates an organic EL device.

BEST MODES OF CARRYING OUT THE INVENTION

Figure 1:
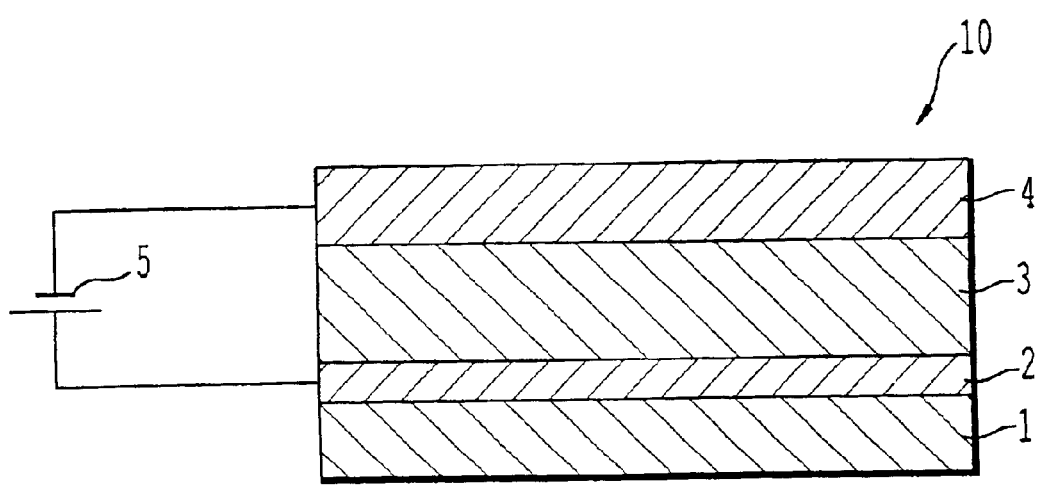
FIG. 1 is a cross-sectional view showing one embodiment of the organic EL device of the invention.

One embodiment of the organic EL device of the invention is described more concretely, with reference to FIG. 1. FIG. 1 is a cross-sectional view showing one embodiment of the organic EL device 10 of the invention. The device 10 is composed of a substrate 1, an anode 2, a light-emitting layer 3 and a cathode 4 as laminated in that order from the bottom. In this, the anode 2 and the cathode 4 are electrically connected with the power source 5, from which is applied a predetermined voltage between the anode 2 and the cathode 4. The light-emitting layer and the other essential constituent components of the organic EL device are described concretely.

1. Light-Emitting Layer:

(1) Molecular Compound:

In the organic EL device of the invention, the light-emitting layer necessarily contains a molecular compound having an electron-transporting unit and a hole-transporting unit bonded to each other directly or via a linking group.

In the molecular compound of that type in which the electron-transporting unit and the hole-transporting unit are physically separated from each other, the two different units can separately transport electrons and holes. Therefore, the molecular compound could realize both a high electron mobility and a high hole mobility. In addition, since the compound transports by itself both electrons and holes, the transportation balance of the compound for both electrons and holes is good. Accordingly, when the compound is in the light-emitting layer of the organic EL device, the layer can emit light of high luminance even when the device is driven at low voltage. Moreover, high-molecular-weight polymers of the molecular compound of that type are easy to produce, and they crystallize little and have good heat resistance. Therefore, the durability of the organic EL device containing the molecular compound is easy to be improved.

In the molecular compound, however, it is desirable that the electron-transporting unit and the hole-transporting unit do not form an exciplex or an charge transfer complex. If the units form an exciplex or a charge transfer complex, the exciplex or the charge transfer complex formed in the light-emitting layer will interfere with energy transfer to the recombination site-forming substance in the layer, whereby the luminance of the device and even the luminous efficiency thereof will be much lowered.

The molecular compound is so defined that the electron-transporting unit and the hole-transporting unit therein are bonded to each other directly or via a linking group therebetween. The electron-transporting unit in the molecular compound is defined as the structural moiety that essentially participates in electron transportation, while the hole-transporting unit therein is as the structural moiety that essentially participates in hole transportation.

It is desirable that the hole mobility through the hole-transporting unit in the molecular compound is at least $1 \times 10^{-6}$ cm$^2$/Vs, but more preferably falls between $1 \times 10^{-4}$ and $5 \times 10^{-1}$ cm$^2$/Vs. With the hole mobility being defined to fall within the range, the organic EL device has the advantage of rapid response. In addition, controlling the hole mobility and the electron mobility in the molecular compound is easy.

The hole mobility through the hole-transporting unit is determined by preparing a compound having a structure that corresponds to the hole-transporting unit, forming the compound alone into a film, and measuring the film for the hole mobility therethrough under a predetermined voltage applied thereto to fall between $1 \times 10^4$ and $1 \times 10^6$ V/cm.

It is desirable that the hole-transporting unit in the molecular compound is one capable of easily forming an Needless-to-say, these are not limitative, and other various compounds in a broad range are usable herein. However, linking groups from ethers, esters, ketones and the like are unfavorable, as causing electron trapping and therefore often degrading the light-emitting layer in the organic EL device.

amorphous solid, since the layer of the compound with the unit of that type is highly durable. More desirably, the unit is substantially transparent to light having a wavelength of 400 nm or longer, in order not to lower the luminance of the device in the range of visible rays.

Compounds corresponding to the hole-transporting unit include triphenylamines. Above all, preferably used herein are compounds having at least two triarylamines.

Accordingly, herein preferred are compound having at least 2 nitrogen elements.

More concretely, mentioned are structures comprising at least one compound of the following formulae (17) to (24). The compounds of formulae (17), (18), (21) and (22) are examples having 2 nitrogen atoms; those of formulae (19) and (20) are examples having 3 nitrogen atoms; and those of formulae (23) and (24) are examples having 4 nitrogen atoms.

(17)

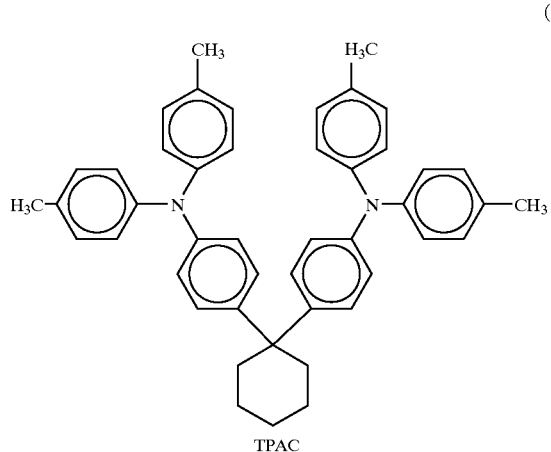

TPAC (18)

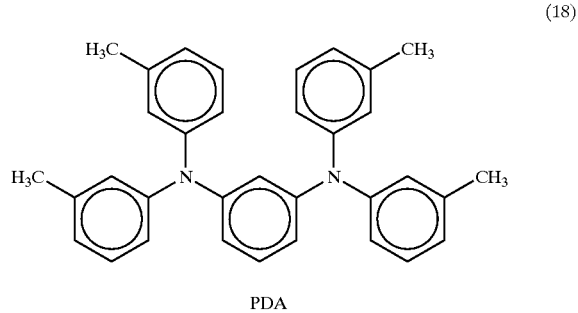

PDA (19)

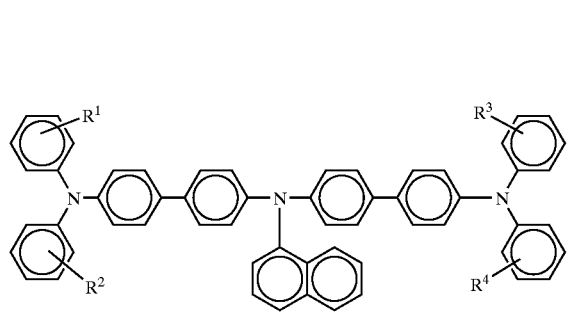

(20)

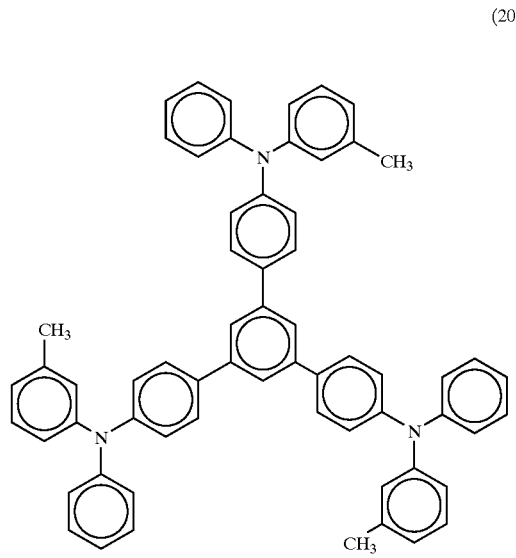

(21)

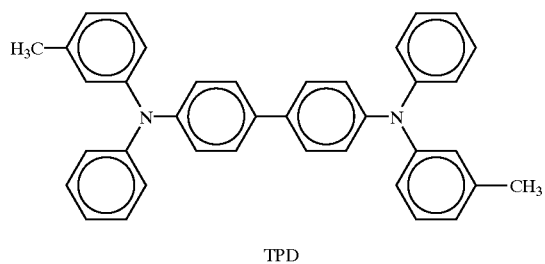

TPD (22)

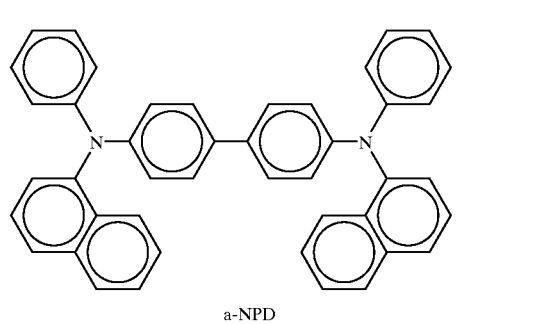

a-NPD

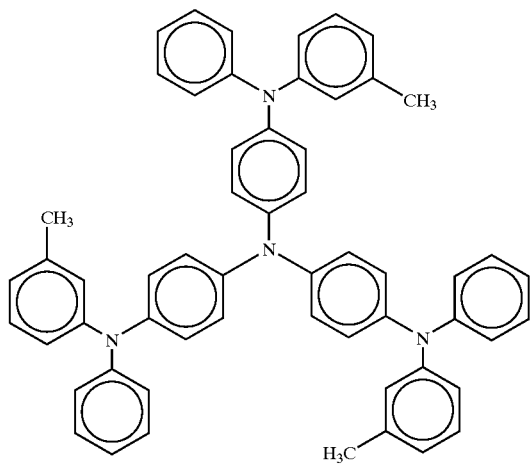

m-MTDATA (23)

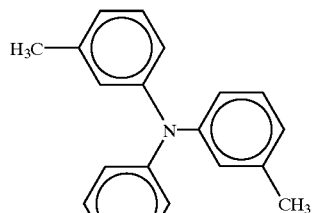
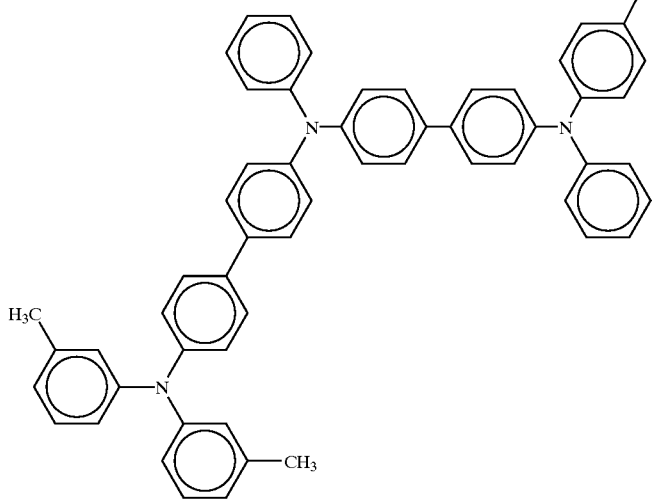

TPTE (24)

In formula (19), $R^1$, $R^2$, $R^3$ and $R^4$ may be the same or different and each represents an alkyl group having from 1 to 10 carbon atoms, an aryl group having from 6 to 20 carbon atoms, an alkyl-substituted aryl group having from 6 to 20 carbon atoms, or an aryloxyaryl group having from 12 to 30 carbon atoms.

In the derivatives for the hole-transporting unit, the terminal phenyl, naphthyl and methyl-substituted phenyl groups may be substituted with any of arylene groups having from 6 to 20 carbon atoms, alkyl-substituted arylene groups having from 6 to 20 carbon atoms, alkoxy-substituted arylene groups having from 6 to 20 carbon atoms, or aryloxyarylene groups having from 12 to 30 carbon atoms.

Similarly, it is also desirable that the electron mobility through the electron-transporting unit in the molecular compound is at least $1 \times 10^{-6}$ cm$^2$/Vs, but more preferably falls between $2 \times 10^{-6}$ and $5 \times 10^{-1}$ cm$^2$/Vs. With the electron mobility being defined to fall within the range, the organic EL device has the advantage of rapid response. In addition, controlling the hole mobility and the electron mobility in the molecular compound is easy.

The electron mobility through the electron-transporting unit is determined by preparing a compound having a structure that corresponds to the electron-transporting unit, forming the compound alone into a film, and measuring the film for the electron mobility therethrough under a predetermined voltage applied thereto to fall between $1\times10^4$ and $1\times10^6$ V/cm.

The electron-transporting unit to be in the molecular compound includes compounds having at least 2, but preferably at least 3 oxadiazole rings, triazole rings, phenanthroline rings, quinoxaline rings or their condensed rings.

More concretely, mentioned are structures comprising at least one compound of the following formulae (25) to (31). The compounds of formulae (25), (26) and (31) are examples of oxadiazole derivatives; the compound of formula (27) is an example of quinoline derivatives; the compound of formula (28) is an example of benzoquinoline derivatives; the compound of formula (29) is an example of phenanthroline derivatives; and the compound of formula (30) is an example of triazole derivatives.

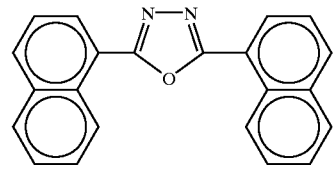

BND
(25)

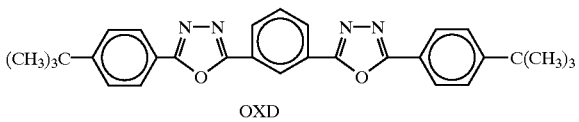

OXD
(26)

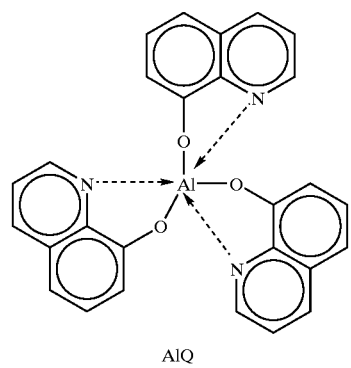

AlQ
(27)

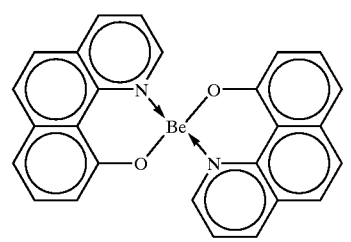

Bebq2
(28)

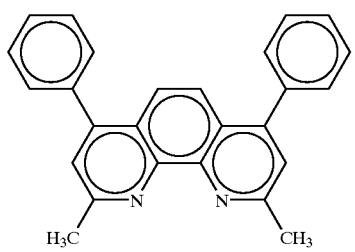

MEPHPH
(29)

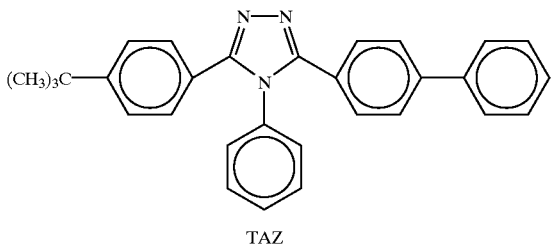

TAZ
(30)

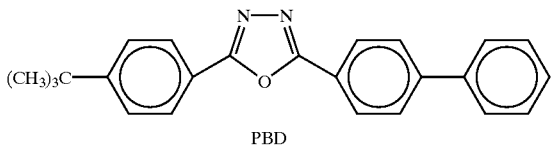

PBD
(31)

As is seen from the compounds of formulae (27) and (28), the derivatives for the electron-transporting unit referred to herein include examples of metal complexes. In addition, in the compounds mentioned above, the terminal phenyl, biphenyl, alkyl-substituted phenyl, naphthyl and alkyl groups may be substituted with any of aryl groups having from 6 to 20 carbon atoms, alkyl-substituted aryl groups having from 6 to 20 carbon atoms, or aryloxyaryl groups having from 12 to 30 carbon atoms.

Next described is the linking group in the molecular compound, via which the electron-transporting unit and the hole-transporting unit are bonded to each other. The linking group is not specifically defined, provided that it chemically links the electron-transporting unit and the hole-transporting unit in the molecular compound without interfering with the functions of the units, and it includes a single bond.

As the linking group, however, the preferred examples are alkylene, vinylene, ethanediylidene, styryl, ether, amine and arylene groups, since the molecular compound existing in the light-emitting layer could realize well-balanced electron-transporting capabilities and hole-transporting capabilities of the units being bonded to each other via the linking group and since the light-emitting layer comprising the molecular compound of that type is highly durable. In addition, the molecular compounds of that type are easy to be produced.

The linking group may be substituted or not substituted with an alkyl group having from 1 to 6 carbon atoms (including its halide and a cycloalkyl group), or an aryl group having from 6 to 20 carbon atoms.

Of the alkylene linking group, the more preferred examples are one having from 1 to 6 carbon atoms, such as a methylene, ethylene, trimethylene or tetramethylene group, since the electron-transporting unit and the hole-transporting unit in the molecular compound can be physically separated from each other by a certain distance therebetween, and since it is easy to well control the balance of the electron-transporting capabilities and the hole-transporting capabilities of the molecular compound.

Of the arylene linking group, more preferred is a phenylene, naphthylene or anthracene-diyl group having from 6 to 40 carbon atoms, since the electron-transporting unit and the hole-transporting unit in the molecular compound can be physically separated from each other by a certain distance therebetween, and since the heat resistance of the molecular compound is high.

The linking group may form a part of the electron-transporting unit or the hole-transporting unit, which is described. The case means that a part of the hole-transporting unit and a part of the electron-transporting unit are the same and the two units are bonded to each other via the same and common part in the molecular compound. For this case, therefore, an electron-transporting unit and a hole-transporting unit of that type capable of separately transporting electrons and holes, respectively, are selected and are bonded to each other via the determined same part in them. The molecular compound having the units as bonded to each other therein in that manner is within the scope of the invention. As the same part common to the two units, preferred are an aryl group having from 6 to 20 carbon atoms, and an alkyl group having from 1 to 60 carbon atoms.

(2) Recombination Site-Forming Substance:

The recombination site-forming substance to be used herein is defined as a substance that preferably provides a site where the electrons and the holes having been injected into the light-emitting layer from the both electrodes are recombined in the light-emitting layer (this may be referred to as a dopant), or is defined as a substance that does not directly participate in the recombination of electrons and holes but provides a site to which hole-electron recombination energy is transferred to emit light. Specifically, this is a substance having a high fluorescent quantum yield, and is added to the light-emitting layer when the luminance from the layer comprising the molecular compound alone is poor, in order to compensate for lack of the light-emitting ability of the layer. With the recombination site-forming substance therein, electrons and holes are forcedly recombined around the center of the light-emitting layer, thereby increasing the luminance from the layer.

For the recombination site-forming substance, therefore, usable are any materials having a high fluorescent quantum yield. Concretely mentioned are styrylamine compounds, quinacridone derivatives, rubrene derivatives, coumarin derivatives and pyran derivatives, one or more of which are used either singly or as combined.

As the recombination site-forming substance, also preferred are polyarylenevinylene derivatives of conjugated polymers, and especially preferred are polyarylene or vinylene derivatives substituted with an alkyl and/or alkoxy groups having from 1 to 50 carbon atoms. More concretely mentioned are compounds of the following formulae (32) to (42), at least one of which may be used herein.

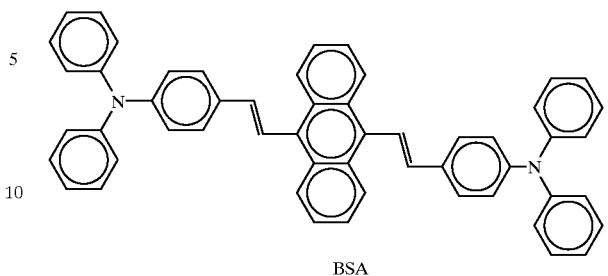

(32)

BSA

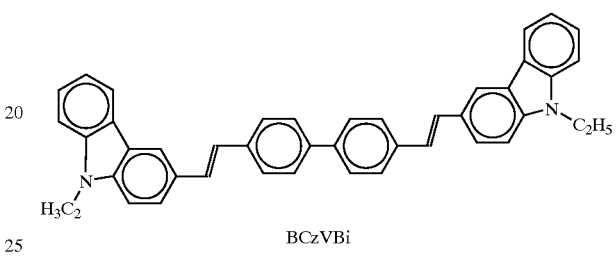

(33)

BCzVBi

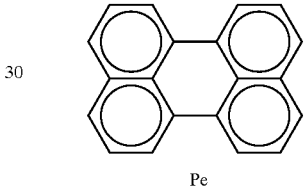

(34)

Pe

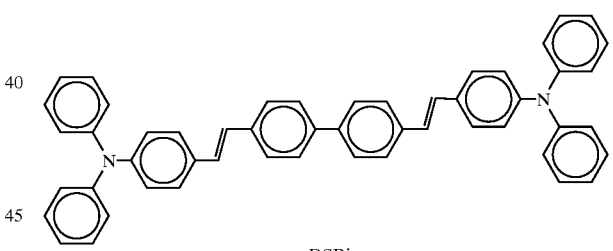

(35)

DSBi

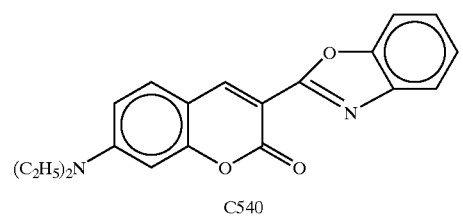

(36)

C540

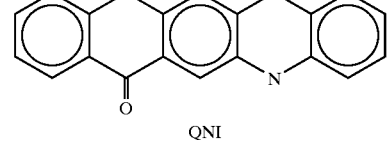

(37)

QNI

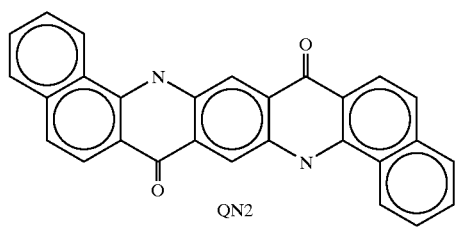

QN2

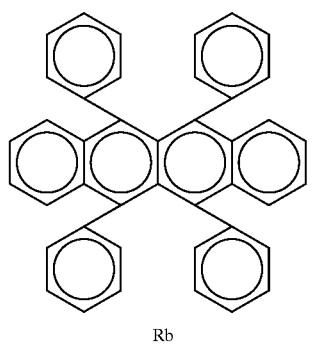

Rb

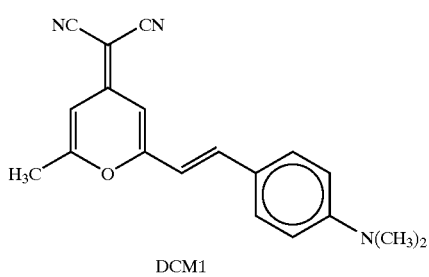

DCM1

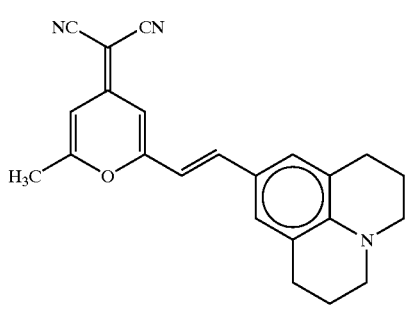

DCM2

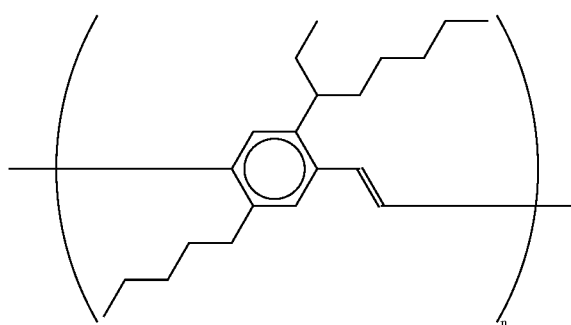

BuEH-PPV

In formula (42), n indicates the number of the repetitive units, and is an integer of at least 50.

Also preferably, the recombination site-forming substance is selected in consideration of the color to be emitted by the light-emitting layer. For example, when the light-emitting layer is desired to emit blue, preferred are any of perylene (Pe) of formula (34), or amino-substituted distyrylarylene derivatives (BSAs) of formulae (33) and (35).

When the light-emitting layer is desired to emit green, preferred are any of QN1 of formula (37) and QN2 of formula (38) of quinacridone derivatives, or C-540 of formula (36) of a coumarin derivative.

When the light-emitting layer is desired to emit blue, preferred is the rubrene (Rb) derivative of formula (39).

When the light-emitting layer is desired to emit orange or reddish orange, preferred are any of DCM1 of formula (40) and DCM2 of formula (41) of dicyanomethylpyran derivatives.

The recombination site-forming substance noted above may be bonded to a molecular compound of the type noted above via a single bond or a linking group of the type noted above therebetween, and the thus-bonded compounds may also be used as the recombination site-forming substance herein.

The amount of the recombination site-forming substance to be in the light-emitting layer is described. The amount of the recombination site-forming substance to be therein shall be determined, depending on the luminance from the light-emitting layer and on the color to be emitted by the layer. Concretely, it is desirable that the amount of the substance falls between 0.1 and 20 parts by weight based on 100 parts by weight of the molecular compound in the layer. If the amount of the recombination site-forming substance is smaller than 0.1 parts by weight, the luminance from the light-emitting layer will be often low; but if larger than 20 parts by weight, the durability of the layer will be low.

Therefore, it is more desirable that the amount of the recombination site-forming substance to be in the light-emitting layer falls between 0.5 and 20 parts by weight, even more desirably between 1.0 and 10 parts by weight, based on 100 parts by weight of the molecular compound therein, since the balance of the luminance and the durability of the organic EL device is improved more.

(3) Structure:

The structure (morphology) of the light-emitting layer is not also specifically defined. Preferably, however, the layer has a single-layered structure, as being easy to form. If desired, however, the organic EL device may optionally but preferably have a combination of any of an electron injection layer, a hole injection layer, an electron transportation layer and a hole transportation layer, in addition to the light-emitting layer.

The thickness of the light-emitting layer is not also specifically defined, but preferably falls between 100 and 10000 angstroms. Thin light-emitting layers having a uniform thickness of smaller than 100 angstroms with no pin holes are difficult to form, and the mechanical strength of such thin layers is often low. On the other hand, to form thick light-emitting layers having a thickness of larger than 10000 angstroms take a lot of time for their production and are therefore not economical.

For these reasons, it is more desirable that the thickness of the light-emitting layer falls between 200 and 3000 angstroms, even more desirably between 300 and 1000 angstroms.

(4) Production Method:

The method for forming the light-emitting layer is not also specifically defined. The layer may be formed in any ordinary manner. For example, employable is a vacuum vapor deposition method, a sputtering method or an LB film-forming method. As the case may be, a molecular compound and a recombination site-forming substance are dissolved in an organic solvent, and the resulting solution may be coated on an electrode and dried thereon to form a light-emitting layer.

2. Electrodes:

(1) Anode:

As the anode, preferred are metals, alloys and electroconductive compounds having a large work function (of, for example, at least 4.0 eV). Their mixtures are also usable. Concretely mentioned are indium tin oxide (ITO), indium zinc oxide, tin, zinc oxide, gold, platinum and palladium, one or more of which are used either singly or as combined.

The thickness of the anode is not also specifically defined, but preferably falls between 10 and 1000 nm, more preferably between 10 and 200 nm.

In order that the light having been emitted by the light-emitting layer in the organic EL device could effectively passes through the anode to go outside, it is desirable that the anode is substantially transparent, more concretely having a light transmittance of at least 10%.

(2) Cathode:

As the cathode, preferred are metals, alloys and electroconductive compounds having a small work function (of, for example, smaller than 4.0 eV). Their mixtures are also usable. Concretely mentioned magnesium, aluminum, indium, lithium, sodium and silver, one or more of which are used either singly or as combined.

The thickness of the cathode is not also specifically defined, but preferably falls between 10 and 1000 nm, more preferably between 10 and 200 nm.

The organic EL device of the invention is described in more detail with reference to the following Examples.

PRODUCTION EXAMPLES

Production Example 1

Production of Compound 1

(1) Production of TPD':

111 g (330 mmols) of compound ①, 36 g (166 mmols) of 3-iodotoluene, 57.0 g (41 mmols) of potassium carbonate, and 26 g (415 mmols) of activated copper were put into a reactor, and stirred in an argon atmosphere at 220° C. for 48 hours. After the reaction, the reaction mixture was dissolved in 1,2-dichloroethane, and filtered to remove copper. The solvent was evaporated away, and the product was subjected to silica gel chromatography (solvent for development: ethyl acetate/n-hexane=1/1) to collect the intended fraction. 30 g of the intended compound was obtained. In its mass analysis (FD-MS), the compound gave m/z=426. From the result, the compound obtained was identified as TPD'.

(2) Production of PBD (ST):

10 g (26 mmols) of PBD (CHO) as prepared by formylating a commercial product PBD through Vilsmyer reaction, and 8 g (26 mmols) of 3-bromobenzyldiethyl phosphite were suspended in 100 ml of DMSO. To this was added 3.0 g (26 mmols) of potassium t-butoxide, and stirred at room temperature for 5 hours. 100 ml of methanol was added to the reaction product, and the crystal formed was recrystallized from toluene to obtain 7.0 g of white powder. This was subjected to mass analysis (FD-MS), and gave m/z=535. From the result, the compound obtained was identified as PBD (ST).

(3) Production of Compound 1:

8.5 g (19.9 mmols) of TPD' obtained in (1), 50 ml of xylene, 2.7 g of t-BuONa, and 0.15 g of PdC12(PPh3) were put into a reactor, which was set in an oil bath. These were stirred in an argon atmosphere for 30 minutes, with the oil bath kept at 125° C. To these was added 10 g (19.9 mmols), in 40 ml of toluene, of PBD (ST) having been prepared in (2), and stirred for 3 hours. The reaction mixture was poured into 100 ml of water, and the crude crystal formed was recrystallized from toluene. The resulting compound was purified through sublimation in high vacuum, for which the boat temperature was 380° C. Thus was obtained 1.0 g of a pale yellow compound. In its mass analysis (FD-MS), the compound gave m/z=878. From the result, the compound was identified as compound 1.

Production Scheme for Compound 1

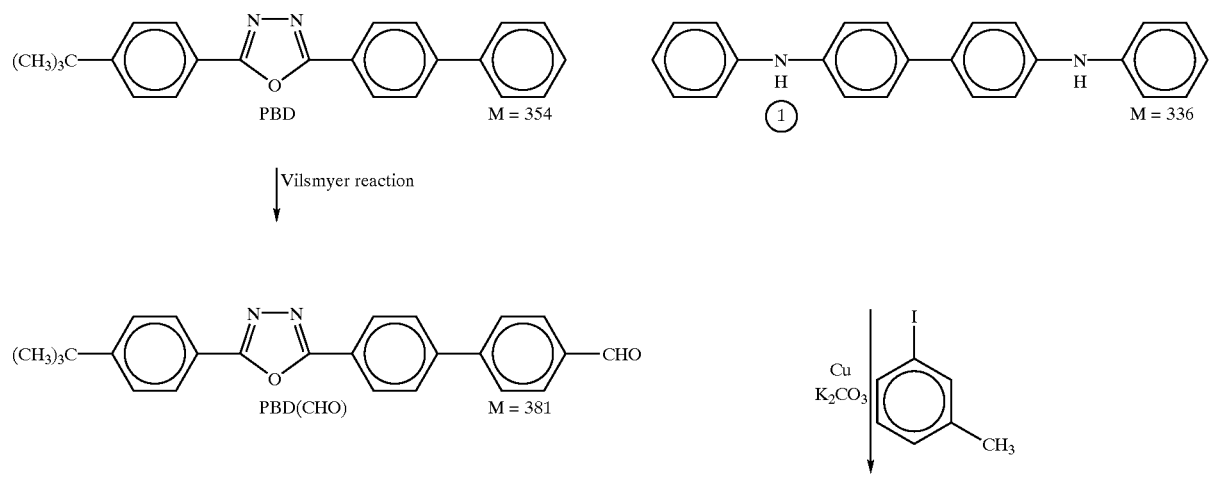

-continued

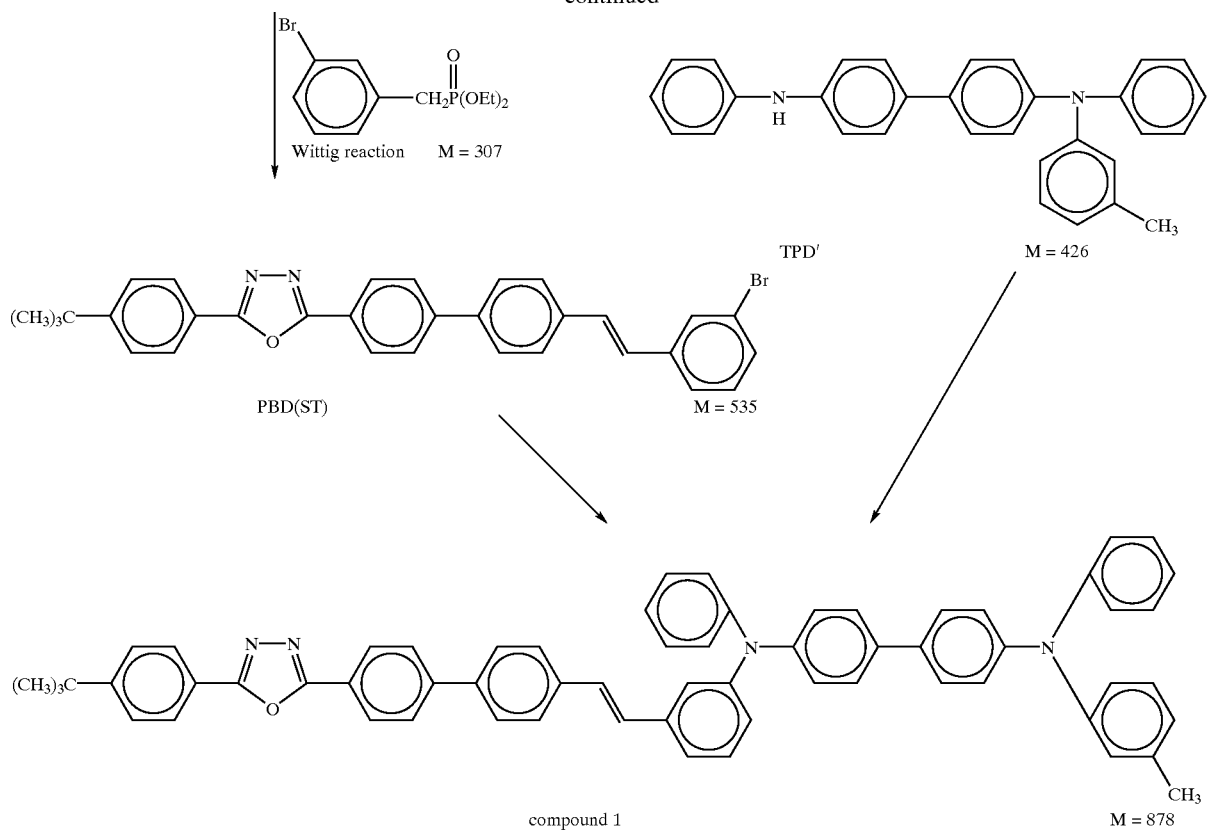

compound 1

Production Example 2

Production of Compound 8

(1) Production of N,N'-diphenyl-N-(4-nitrophenyl)-1,1'-biphenyl-4,4'-diamine ②:

To 30.0 g (89 mmols) of N,N'-diphenylbenzidine ①, 25.0 g (178 mmols) of p-fluoronitrobenzene, and 13.5 g (89 mmols) of cesium fluoride, added was 350 ml of DMSO serving as a solvent, and these were stirred in an argon atmosphere at 100° C. for 24 hours. After the reaction, the reaction mixture was poured into 5000 ml of water, and this gave crude red crystal of ②. The crude crystal was dried at 50° C. under reduced pressure for 12 hours, and then directly used in the next step. The crude yield was 40.0 g.

(2) Production of N,N'-diphenyl-N-(4-nitrophenyl)-N'-(3-methylphenyl)-1,1'-biphenyl-4,4'-diamine ③:

40 g (87.5 mmols) of compound ②, 36 g (166 mmols) of 3-iodotoluene, 57.0 g (41 mmols) of potassium carbonate, and 26 g (415 mmols) of activated copper were put into a reactor, and stirred in an argon atmosphere at 220° C. for 48 hours. After the reaction, the reaction mixture was dissolved in 1,2-dichloroethane, and filtered to remove copper. The solvent was evaporated away, and the product was purified through silica gel chromatography (solvent for development: ethyl acetate/n-hexane=1/1). 15 g of the intended compound was obtained. In its mass analysis (FD-MS), the compound gave m/z=426. From the result, the compound obtained was identified as compound ③.

(3) Production of N,N'-diphenyl-N-(4-aminophenyl)-N'-(3-methylphenyl)-1,1'-biphenyl-4,4'-diamine ④:

200 ml of DMF was added to 14.5 g (26.5 mmols) of compound ③ and 53 g of 5% palladium-carbon, and the nitro compound ③ was reduced in a hydrogen atmosphere at room temperature (18° C.) under normal pressure into an amine compound. After 8 hours for the reaction, the palladium-carbon was removed through filtration through a membrane filter, and the resulting filtrate was put into 500 ml of water. The crude product was recrystallized from toluene, and 13 g of pale yellow powder was obtained. In its mass analysis (FD-MS), the compound gave m/Z=517. From the result, the compound was identified as compound ④.

(4) Production of Compound 8:

6.5 g (12.6 mmols) of compound ④ having been prepared in the above, 18.7 g (38 mmols) of oxadiazole derivative ⑤ (this oxadiazole derivative was prepared through reaction of 5-iodoisophthaloyl chloride and 5-phenyltetrazole according to the disclosure in *Synthetic Metals*, 91 (1997), 223–228), 17.6 g (126 mmols) of potassium carbonate, and 8 g (126 mmols) of activated copper were put into a reactor, and stirred in an argon atmosphere at 220° C. for 48 hours. After the reaction, the reaction mixture was dissolved in THF, and filtered to remove copper. The solvent THF was evaporated away, and the product was purified through column chromatography (solvent for development: toluene/n-hexane=2/1).

The resulting compound was purified through sublimation in high vacuum, for which the boat temperature was 340° C. Thus was obtained 1.0 g of a pale yellow compound. In its mass analysis (FD-MS), the compound gave m/z=1245. From the result, the compound was identified as compound 8.

Production Scheme for Compound 8
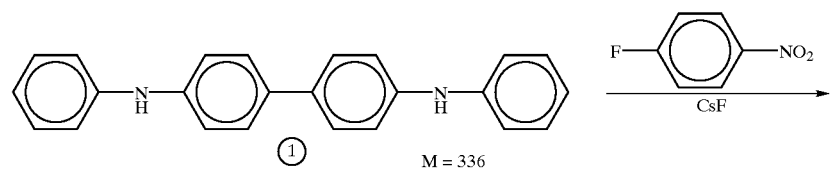
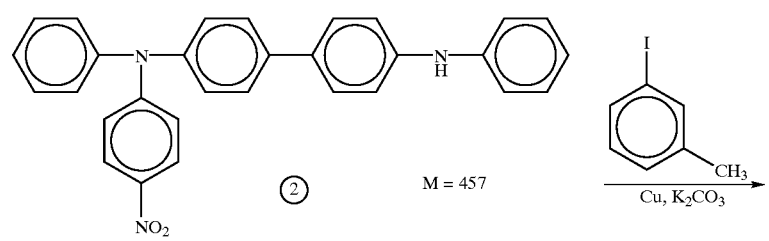
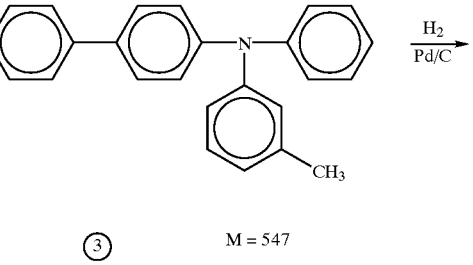
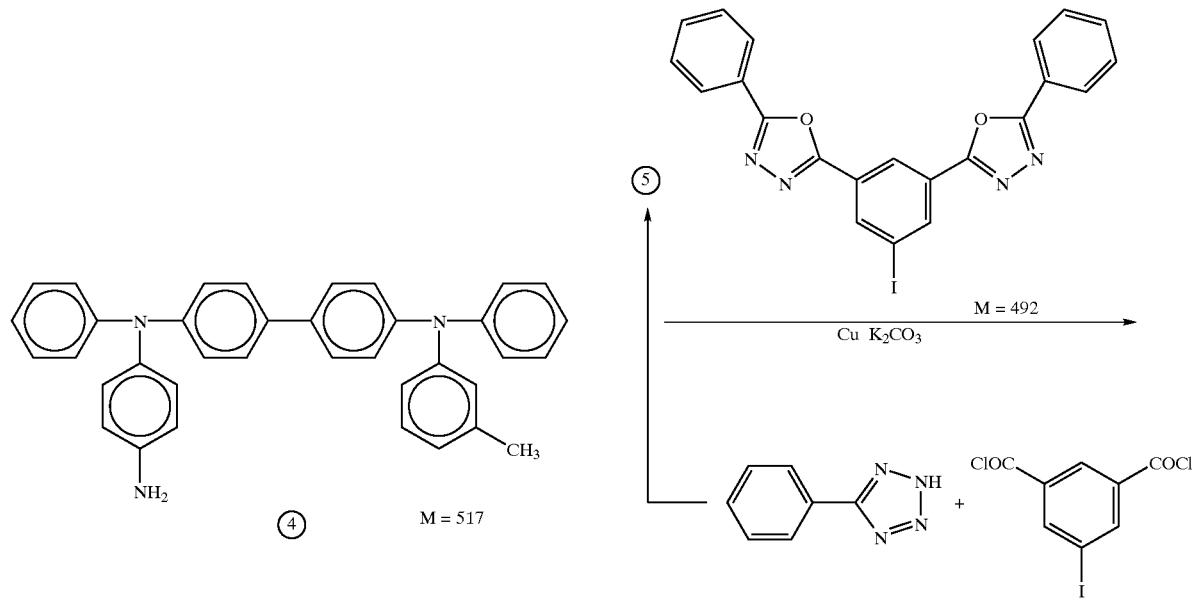

-continued

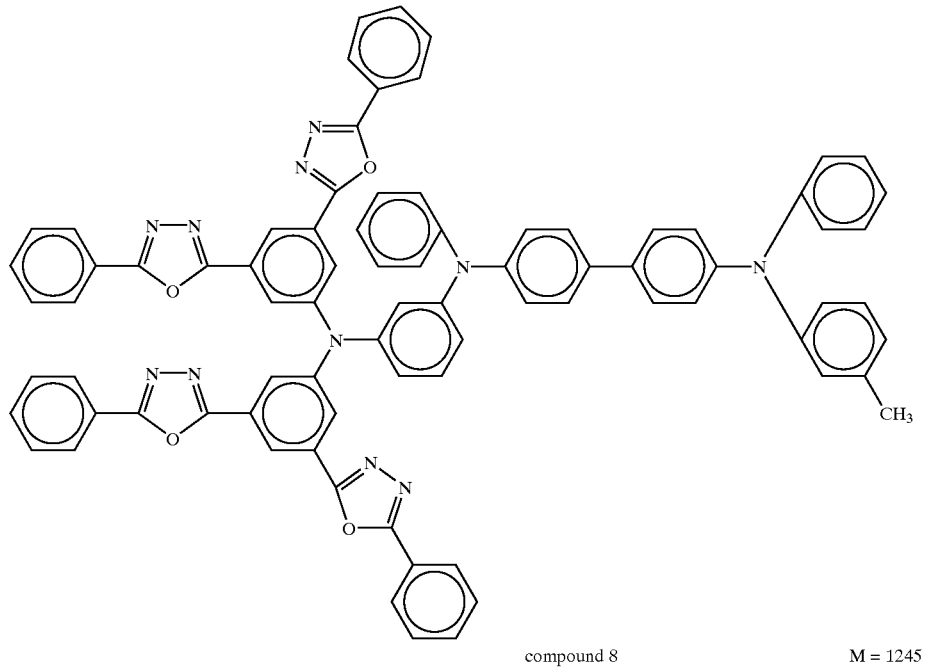

compound 8    M = 1245

Production Example 3

Production of Compound 9

(1) Production of N,N'-diphenyl-N,N'-(4-aminophenyl)-1,1'-biphenyl-4,4'-diamine (7):

250 ml of DMF was added to 355 g (60.5 mmols) of compound (6) and 25 g of 5% palladium-carbon, and the nitro compound (6) was reduced in a hydrogen atmosphere at room temperature (18° C.) under normal pressure into an amine compound. After 8 hours for the reaction, the palladium-carbon was removed through filtration through a membrane filter, and the resulting filtrate was put into 500 ml of water. The crude product was recrystallized twice from toluene, and 27 g of pale yellow powder was obtained. In its mass analysis (FD-MS), the compound gave m/Z=518. From the result, the compound was identified as compound (7).

(2) Production of Compound 9:

7.6 g (14.7 mmols) of compound (7) having been prepared in the above, 197 g (400 mmols) of oxadiazole derivative (5) (this oxadiazole derivative was prepared through reaction of 5-iodoisophthaloyl chloride and 5-phenyltetrazole according to the disclosure in *Synthetic Metals,* 91 (1997), 223–228), 19.2 g (139 mmols) of potassium carbonate, and 8.8 g (139 mmols) of activated copper were put into a reactor, and stirred in an argon atmosphere at 220° C. for 48 hours. After the reaction, the reaction mixture was dissolved in THF, and filtered to remove copper. The solvent THF was evaporated away, and the product was purified through column chromatography (solvent for development: toluene/n-hexane=2/1).

The resulting compound was purified through sublimation in high vacuum, for which the boat temperature was 380° C. Thus was obtained 1.2 g of a pale yellow compound. In its mass analysis (FD-MS), the compound gave m/z=1974. From the result, the compound was identified as compound 9.

Production Scheme for Compound 9

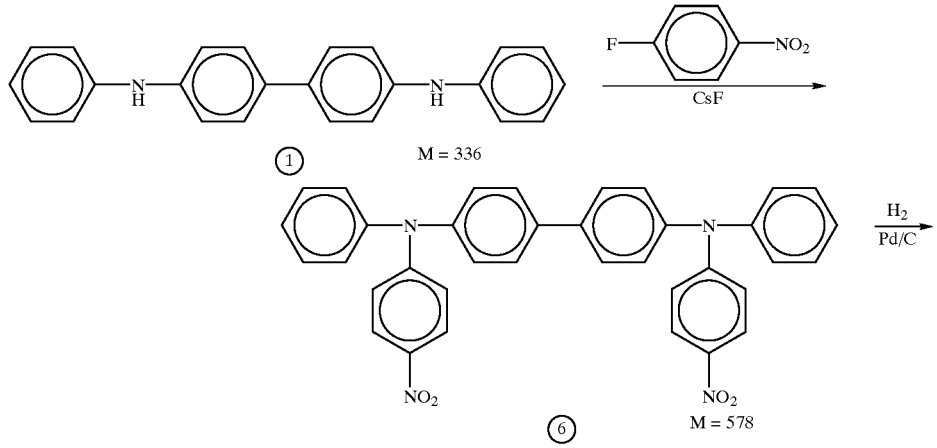

-continued

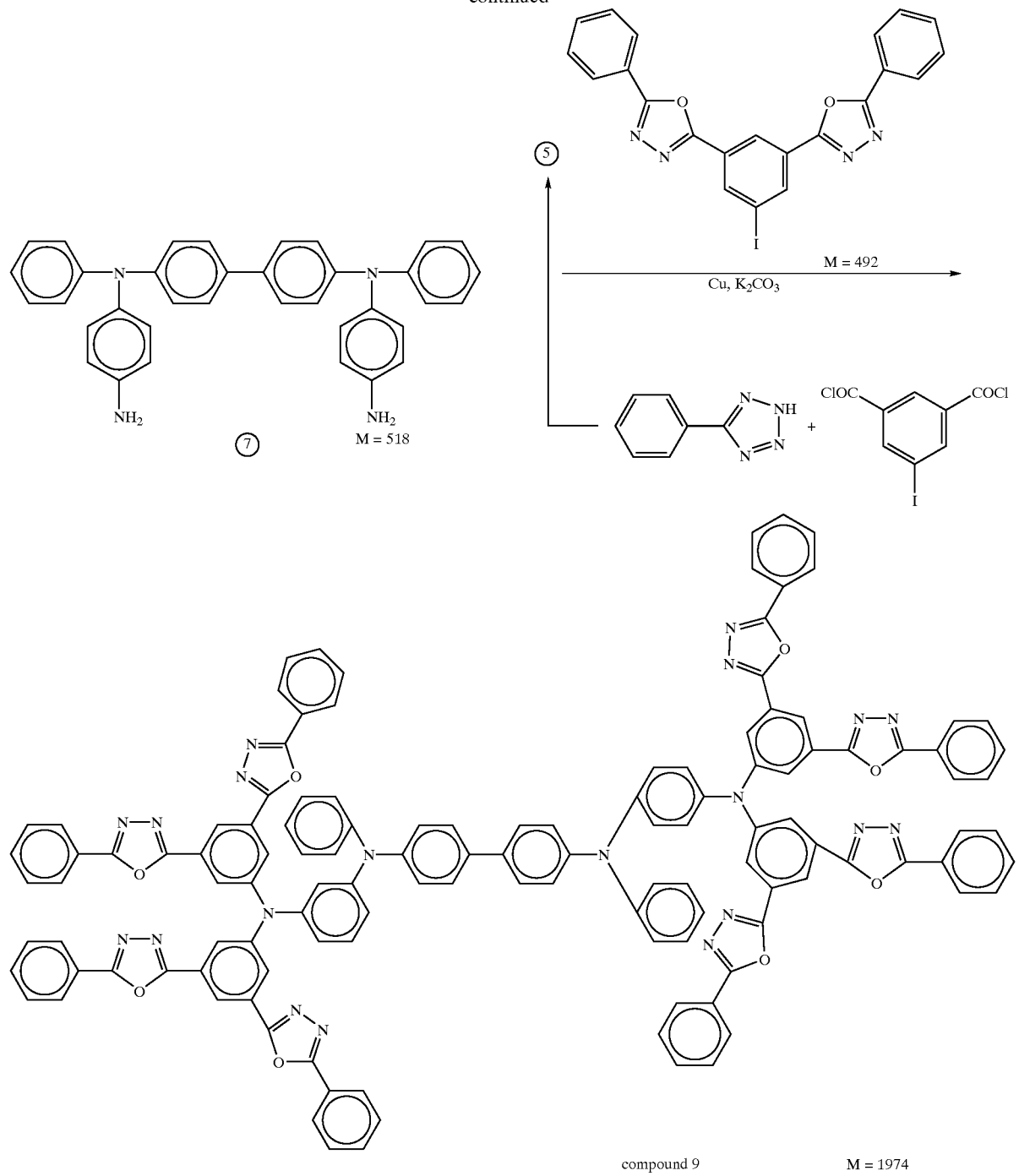

compound 9  M = 1974

Example 1
(Fabrication of Organic EL Device)

A transparent supporting substrate was prepared by forming a thin film of indium tin oxide (ITO) having a thickness of 100 nm through vapor deposition on a glass substrate having a length of 25 mm, a width of 75 mm and a thickness of 1.1 mm. The ITO film serves as an anode. The transparent supporting substrate was ultrasonically cleaned with isopropyl alcohol for 5 minutes, and then with pure water for 5 minutes. This was dried with a nitrogen blow, and then cleaned with UV ozone for 30 minutes.

Next, the thus-cleaned, transparent supporting substrate was fixed in a holder in a vacuum chamber in a vacuum vapor deposition apparatus (from Nippon Vacuum Technology). The vacuum chamber had two resistance heating boats of molybdenum therein, and 200 mg of the molecular compound of formula (1) and 200 mg of the recombination site-forming substance of formula (26), 4,4'-bis[2-(4-(N,N-diphenylamino)phenyl)vinyl]biphenyl (DSBi), were separately put into the two boats.

In that condition, the vacuum chamber was degassed to a reduced pressure of $1\times10^{-4}$ Pa, and then both the two resistance heating boats therein were heated. As a result, a light-emitting layer of the molecular compound and the recombination site-forming substance, having a thickness of 80 nm, was formed on the substrate. In the light-emitting layer thus formed, the blend ratio of the molecular compound to the recombination site-forming substance was confirmed to be 40/1 by weight.

Next, the transparent supporting substrate having the light-emitting layer formed thereon was taken out of the vacuum chamber, and a stainless steel mask was attached to the surface of the light-emitting layer so as to cover the area except that on which an electrode is to be formed. The substrate was again fixed in the holder in the vacuum chamber. The vacuum chamber had a tungsten basket therein, and 0.5 g of silver wire was put in the basket. In addition, 1 g of magnesium ribbon was put in the resistance heating boat.

In that condition, the vacuum chamber was degassed to a reduced pressure of $1 \times 10^{-4}$ Pa, and both the basket and the resistance heating boat were heated, whereupon silver and magnesium were vaporized and deposited on the non-covered area of the light-emitting layer at a vapor deposition rate of 0.1 nm/sec for silver and at 1.8 nm/sec for magnesium. In that manner, a cathode (magnesium/silver mixture electrode) having a thickness of 200 nm was formed on the light-emitting layer. Thus was fabricated an organic EL device of the invention.

(Evaluation of Organic EL Device)

A voltage of 10 V to give a current density of 20 mA/cm$^2$ was applied between the anode and the cathode of the thus-fabricated organic EL device, and the initial capabilities of the device were checked. In that condition, the device emitted uniform blue light having a peak wavelength of 465 nm. The luminance of the blue light emitted by the device was measured with a luminometer. As a result, the luminance was 95 cd/m$^2$ and was high. The luminous efficiency of the device was 0.15 lumens/W.

After having been tested for its initial capabilities, the organic EL device was kept in a nitrogen atmosphere, and varying voltage was applied thereto. The voltage at which the device gave a luminance of 100 cd/m$^2$ was determined. With the determined voltage being applied thereto, the device was kept driven at the constant voltage. The device took a long period of time of about 1000 hours until its luminance was reduced to a half of the initial value, 50 cd/m$^2$. The data prove high durability of the organic EL device of the invention.

Example 2

(Fabrication of Organic EL Device)

An organic EL device was fabricated in the same manner as in Example 1, except that the molecular compound of formula (4) and DCM1 of formula (40) were used herein in place of the molecular compound of formula (1) and 4,4'-bis[2-(4-(N,N-diphenylamino)phenyl)vinyl]biphenyl (DSBi), respectively, used in Example 1.

(Evaluation of Organic EL Device)

A voltage of 10 V to give a current density of 20 m/cm$^2$ was applied between the anode and the cathode of the thus-fabricated, organic EL device, and the initial capabilities of the device were checked. In that condition, the device emitted uniform orange light having a peak wavelength of 580 nm. The luminance of the orange light emitted by the device was measured with a luminometer. As a result, the luminance was 47 cd/m$^2$ and was high. The luminous efficiency of the device was 0.07 lumens/W.

After having been tested for its initial capabilities, the organic EL device was kept in a nitrogen atmosphere, and varying voltage was applied thereto. The voltage at which the device gave a luminance of 100 cd/m$^2$ was determined. With the determined voltage being applied thereto, the device was kept driven at the constant voltage. The device took a long period of time of about 1000 hours until its luminance was reduced to a half of the initial value, 50 cd/m$^2$. The data prove high durability of the organic EL device of the invention.

Examples 3 to 7

(Fabrication of Organic EL Devices)

In Examples 3, 4 and 6, different organic EL devices were fabricated in the same manner as in Example 1, except that the molecular compounds shown in Table 1 were used in place of the molecular compound of formula (1) used in Example 1. Precisely, in Example 3, used was the molecular compound of formula (2) in Example 4, used was the molecular compound of formula (3); and in Example 6, used was the molecular compound of formula (5). In Examples 5 and 7, fabricated were different organic EL devices also in the same manner as in Example 1, except that the molecular compounds of formulae (4) and (6), respectively, were used and that the recombination site-forming substance was not added to the light-emitting layer.

(Evaluation of Organic EL Devices)

In the same manner as in Example 1, a voltage of 10 V to give a current density of 20 m/cm$^2$ was applied between the anode and the cathode of each organic EL device fabricated herein, and the initial capabilities of each device were checked. The luminance and the luminous efficiency of each device, and the color emitted by each device are shown in Table 1.

TABLE 1

| Example | Molecular Compound | Recombination Site-Forming Substance | Color | Voltage (V) | Current (mA/cm$^2$) | Luminance (cd/m$^2$) | Luminous Efficiency (1 m/W) |
|---|---|---|---|---|---|---|---|
| 1 | formula (1) | DSBi | blue | 10 | 20 | 95 | 0.15 |
| 2 | formula (4) | DCM1 | orange | 10 | 20 | 47 | 0.07 |
| 3 | formula (2) | DSBi | blue | 10 | 18 | 70 | 0.12 |
| 4 | formula (3) | DSBi | blue | 10 | 18 | 80 | 0.14 |
| 5 | formula (4) | not added | green | 10 | 21 | 100 | 0.15 |
| 6 | formula (5) | DSBi | blue | 10 | 20 | 200 | 0.31 |
| 7 | formula (6) | not added | green | 10 | 21 | 150 | 0.22 |
| 8 | formula (1) | BuEH-PPV | green | 7 | 20 | 120 | 0.27 |
| 9 | formula (8) | not added | blue | 10 | 16 | 150 | 0.29 |
| 10 | formula (8) | DSBi | blue | 10 | 18 | 200 | 0.35 |
| 11 | formula (9) | Rb | yellow | 10 | 18 | 180 | 0.31 |
| 12 | formula (10) | Rb | yellow | 10 | 18 | 180 | 0.31 |
| 13 | formula (11) | QN1 | green | 10 | 17 | 210 | 0.39 |
| 14 | formula (13) | QN2 | green | 10 | 18 | 200 | 0.35 |

Example 8

(Fabrication of Organic EL Device)

A transparent supporting substrate was prepared by forming a thin film of indium tin oxide (ITO) having a thickness of 100 nm through vapor deposition on a glass substrate having a length of 25 mm, a width of 75 mm and a thickness of 1.1 mm. The ITO film formed serves as an anode. The transparent supporting substrate was ultrasonically cleaned with isopropyl alcohol for 5 minutes, and then with pure water for 5 minutes.

On the other hand, the molecular compound of formula (1) and the recombination site-forming substance of formula (42), butylethylhexylpolyphenylene derivative, were put into a reactor, and uniformly dissolved in toluene to prepare a coating solution.

Next, the coating solution was coated on the transparent supporting substrate, using a spin coater being spun at 1000 rpm. Then, the substrate was dried under heat, and a light-emitting layer having a thickness of 95 nm was formed thereon.

Next, a cathode (magnesium/silver mixture electrode) having a thickness of 200 nm was formed on the light-emitting layer, in the same manner as in Example 1. Thus was fabricated an organic EL device of the invention.

(Evaluation of Organic EL Device)

A voltage of 7 V was applied between the anode and the cathode of the thus-fabricated, organic EL device, and the initial capabilities of the device were checked. In that condition, the device emitted uniform green light. The luminance of the device was measured with a luminometer. As a result, it was 120 cd/m$^2$ and was high. The luminous efficiency of the device was 0.27 lumens/W.

Examples 9 to 14

(Fabrication of Organic EL Devices)

Different organic EL devices were fabricated in the same manner as in Example 8, except that the molecular compounds and the recombination site-forming substances shown in Table 1 were used in place of those used in Example 8.

(Evaluation of Organic EL Devices)

In the same manner as in Example 1, a voltage of 10 V to give a current density of 20 mA/cm$^2$ was applied between the anode and the cathode of each organic EL device fabricated herein, and the initial capabilities of each device were checked. The luminance and the luminous efficiency of each device, and the color emitted by each device are shown in Table 1.

INDUSTRIAL APPLICABILITY

It has become possible to provide an organic EL device having the advantages of high luminance and good durability, in which the light-emitting layer comprises a molecular compound having an electron-transporting unit and a hole-transporting unit bonded to each other directly or via a linking group therebetween, and contains a recombination site-forming substance. Since the light-emitting layer in the device may have a single-layered structure, the time and the process for its formation can be reduced and simplified. Another advantage of the device is that it is easy to produce.

What is claimed is:

1. An organic electroluminescent device consisting essentially of two electrodes and a light-emitting layer sandwiched therebetween, wherein;

the light-emitting layer has a single layer structure and comprises a molecular compound having an electron-transporting unit and a hole-transporting unit bonded to each other directly or via a linking group; and a recombination site-forming substance wherein said recombination site-forming substance is at least one compound selected from the group consisting of a styrylamine compound, quinacridone derivative, rubrene derivative, coumarin derivative, and pyran derivative.

2. The organic electroluminescent device as claimed in claim 1, wherein the electron mobility through said electron-transporting unit is at least 1×10$^{-6}$ cm$^2$/Vs.

3. The organic electroluminescent device as claimed in claim 1, wherein the hole mobility through said hole-transporting unit is at least 1×10$^{-6}$ cm$^2$/Vs.

4. The organic electroluminescent device as claimed in claim 1, wherein said electron-transporting unit is of at least one compound selected from perinone derivatives, oxadiazole derivatives, triazole derivatives, phenanthroline derivatives, quinoxaline derivatives, silol derivatives condensed polycyclic aromatic derivatives having at least three rings, and quinoline complex derivatives.

5. The organic electroluminescent device as claimed in claim 4, wherein the hole mobility through said hole-transporting unit is at least 1×10$^{-6}$ cm$^2$/Vs.

6. The organic electroluminescent device as claimed in claim 4, wherein said hole-transporting unit is selected from the group consisting of triphenylamines and stilbene derivatives, and a combination thereof.

7. The organic electroluminescent device as claimed in claim 4, wherein said linking group is at least one, selected from the group consisting of alkylene groups, vinylene groups, ethanediylidene groups and arylene groups.

8. The organic electroluminescent device as claimed in claim 4, wherein said linking group is at least one selected from the group consisting of alkylene groups, vinylene groups, ethanediylidene groups, styryl groups, ether groups, amine groups and arylene groups.

9. The organic electroluminescent device as claimed in claim 4, wherein said recombination site-forming substance is at least one compound selected from the group consisting of styrylamine compounds, quinacridone derivatives, rubrene derivatives, coumarin derivatives and pyran derivatives.

10. The organic electroluminescent device as claimed in claim 4, wherein the molecular compound is a copolymer having an electron-transporting unit and a hole-transporting unit.

11. The organic electroluminescent device as claimed in claim 1, wherein said hole-transporting unit is of a combination of triphenylamines and stilbene derivatives, or of any one of the compounds.

12. The organic electroluminescent device as claimed in claim 1, wherein said linking group is at least one selected from alkylene groups, vinylene groups, ethanediylidene groups and arylene groups.

13. The organic electroluminescent device as claimed in claim 1, wherein said linking group is at least one selected from alkylene groups, vinylene groups, ethanediylidene groups, styryl groups, ether groups, amine groups and arylene groups.

14. The organic electroluminescent device as claimed in claim 1, wherein said recombination site-forming substance is at least one compound selected from styrylamine compounds, quinacridone derivatives, rubrene derivatives, coumarin derivatives and pyran derivatives.

15. The organic electroluminescent device as claimed in claim 1, wherein the light-emitting layer is of a copolymer having an electron-transporting unit and a hole-transporting unit.

16. The organic electroluminescent device as claimed in claim 1, wherein the molecular compound is a copolymer having an electron-transporting unit and a hole-transporting unit.

17. The organic electroluminescent device as claimed in claim 4, wherein the electron mobility through said electron-transporting unit is at least $1\times10^{-6}$ cm$^2$/Vs.

* * * * *